United States Patent
Banerjee et al.

[11] Patent Number: 6,031,283
[45] Date of Patent: Feb. 29, 2000

[54] INTEGRATED CIRCUIT PACKAGE

[75] Inventors: Koushik Banerjee, Chandler; Robert J. Chroneos, Jr., Tempe; Tom Mozdzen, Gilbert, all of Ariz.

[73] Assignee: Intel Corporation, Santa Clara, Calif.

[21] Appl. No.: 08/708,857

[22] Filed: Sep. 9, 1996

[51] Int. Cl.[7] .......................... H01L 23/04; H01L 23/48; H01L 23/34

[52] U.S. Cl. ..................... 257/698; 257/693; 257/690; 257/723; 257/724; 257/711; 257/712; 257/924

[58] Field of Search ........................ 257/692, 698, 257/708, 712, 724, 924, 693, 621, 675, 678, 690, 691, 697, 700–703, 737, 738, 779, 723, 711

[56] References Cited

U.S. PATENT DOCUMENTS

| | | | |
|---|---|---|---|
| 5,235,211 | 8/1993 | Hambergen | 257/706 |
| 5,237,204 | 8/1993 | Val | 257/698 |
| 5,319,243 | 6/1994 | Leicht et al. | 257/724 |
| 5,583,378 | 12/1996 | Marrs et al. | 257/712 |
| 5,625,225 | 4/1997 | Huang et al. | 257/698 |

FOREIGN PATENT DOCUMENTS

| | | | |
|---|---|---|---|
| 0 261 013 | 3/1988 | European Pat. Off. | 257/693 |
| 62-137860 | 6/1987 | Japan | 257/924 |
| 4-56158 | 2/1992 | Japan | 257/697 |
| 4-107856 | 4/1992 | Japan | 257/724 |

*Primary Examiner*—Mahshid Saadat
*Assistant Examiner*—Jhihan B Clark
*Attorney, Agent, or Firm*—Blakely, Sokoloff, Taylor & Zafman LLP

[57] ABSTRACT

An integrated circuit package which contains an integrated circuit. The internal integrated circuit is coupled to external lands located on a first outer surface of the package by a plurality of vias. The vias extend through the package from the first outer surface to an opposite second outer surface. The package has a plurality of devices such as capacitors that are mounted to the second outer surface. Some of the vias are connected to a whole group of external lands. Grouping the lands to a single via reduces the number of vias on the second surface of the package. The reduction in vias allows additional capacitors to be mounted to the second surface of the package.

16 Claims, 2 Drawing Sheets

INTEGRATED CIRCUIT PACKAGE

BACKGROUND OF THE INVENTION

1. Field of the Invention

The present invention relates to an integrated circuit package.

2. Description of Related Art

Integrated circuits are typically enclosed by a package that is mounted to a printed circuit board. The package has a plurality of external contacts that are solder to the printed circuit board and dedicated to the various power, ground and signal pins of the integrated circuit. The contacts may be solder balls that are attached to external conductive lands of the package. Packages with external solder balls are typically referred to as ball grid array (BGA) packages.

The packages have internal routing layers which couple the external lands to internal bond fingers that are wire bonded to the surface pads of the integrated circuit. The internal routing typically contains separate layers for a ground bus, a power bus and a plurality of signal lines. The various layers are coupled to the external lands by vias that extend through the substrate.

It is desirable to mount capacitors to an integrated circuit package. The capacitors can either be mounted internally within the package or on the top surface of the package. Mounting the capacitors internally occupies valuable routing space. It is therefore desirable to attach the capacitors to the top surface of the package.

Many packages incorporate a thermally conductive heat slug to facilitate the removal of heat generated by the integrated circuit. The heat slugs are typically attached to the top surface of the package and occupy space that could be utilized for the capacitors. Additionally, the capacitors are mounted to conductive land strips which must be flat to insure a rugged solder joint between the strips and the capacitors. To insure flatness, it is desirable to form the lands in an area that does not have vias. Packages of the prior art require a via for each external land. Removing a via will therefore eliminate a land and may reduce the functionality of the package. The utilization of a heat slug and vias thus limit the space available for the capacitors. It would be desirable to provide an integrated circuit package that contains an optimum number of capacitors without degrading the thermal performance and number of lands on the package.

SUMMARY OF THE INVENTION

The present invention is an integrated circuit package which contains an integrated circuit. The internal integrated circuit is coupled to external lands located on a first outer surface of the package by a plurality of vias. The vias extend through the package from the first outer surface to an opposite second outer surface. The package has a plurality of devices such as capacitors that are mounted to the second outer surface. Some of the vias are connected to a whole group of external lands. Grouping the lands to a single via reduces the number of vias on the second surface of the package. The reduction in vias allows additional capacitors to be mounted to the second surface of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
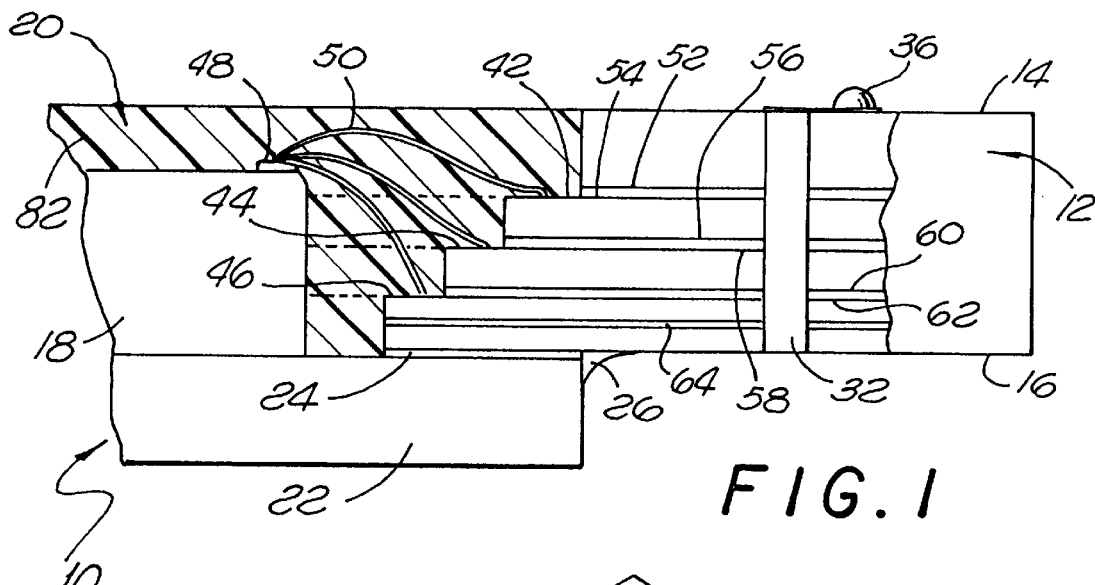
FIG. 1 is a cross-sectional view of an integrated circuit package of the present invention.
Figure 2:
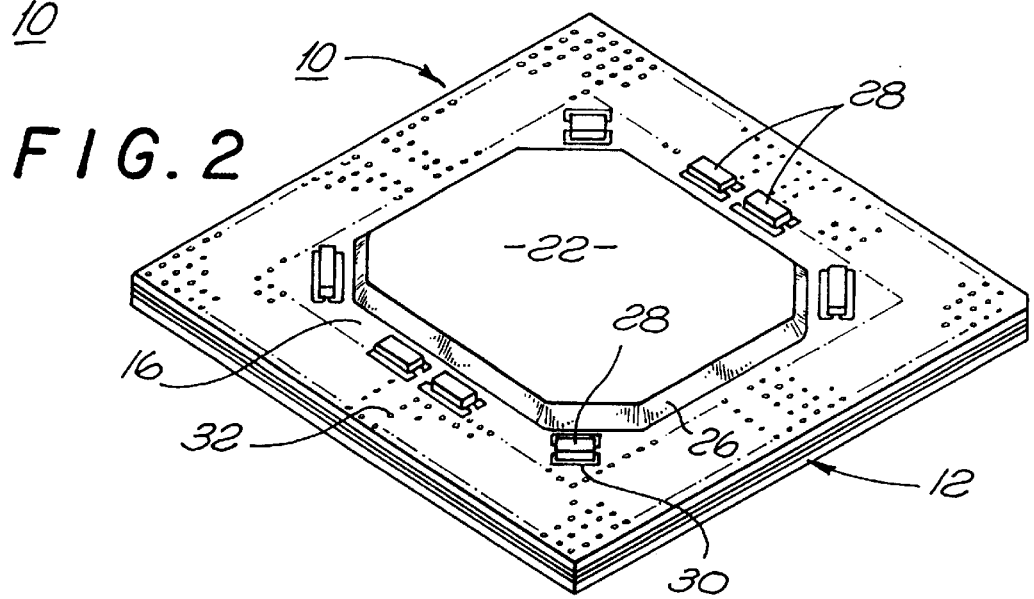
FIG. 2 is a top perspective view of the package.

Referring to the drawings more particularly by reference numbers, FIGS. 1–5 show an integrated circuit package 10 of the present invention. The package 10 includes a substrate 12 that has a first surface 14 and an opposite second surface 16. The substrate 14 is typically constructed as a multilayered printed circuit board, although it is to be understood that the substrate can be constructed with ceramic co-fired processes.

The package 10 includes an integrated circuit 18 located within a die cavity 20 of the substrate 14. The integrated circuit 18 may be a microprocessor or any other electrical device. The integrated circuit 18 is preferably mounted to a heat slug 22 that is attached to the second surface 16 of the substrate 12. The heat slug 22 is typically attached to the substrate 12 with a layer of adhesive 24 and an outer solder fillet 26.

The heat slug 22 is typically constructed from a nickel plated copper material that has a relatively high coefficient of thermal conductivity. The heat slug 22 provides a thermal path of low impedance between the integrated circuit 18 and the ambient of the package. The low thermal impedance of the heat slug 22 reduces the junction temperature of the integrated circuit 18. The heat slug 22 may be electrically connected to the integrated circuit 18 to provide a ground plane for the package 10. Although a heat slug 22 is shown and described, it is to be understood that the integrated circuit 18 may be mounted directly to the substrate 12.

The heat slug 22 preferably has an octagonal shape that has chamfered corners. The chamfered corners increase the amount of usable surface area on the second surface 16. The package 10 may have a plurality of capacitors 28 mounted to land strips 30 located on the second surface 16 of the substrate 12. Although capacitors are shown and described, it is to be understood that any passive or active device can be mounted to the second surface 16.

The package 10 also has a plurality of vias 32 that extend from the second surface 16 to the first surface 14 of the substrate 12. The vias 32 couple the integrated circuit 18 and capacitors 28 to a plurality of lands 34 located on the first surface 14 shown in FIG. 3. The lands 34 are typically connected to an external printed circuit board (not shown) by a plurality of solder balls 36. The solder balls 36 are initially attached to the lands 34 to provide a ball grid array (BGA) package. Although a BGA package is shown and described, it is to be understood that the package may have other external contacts such as pins or solder columns.

Figure 3:
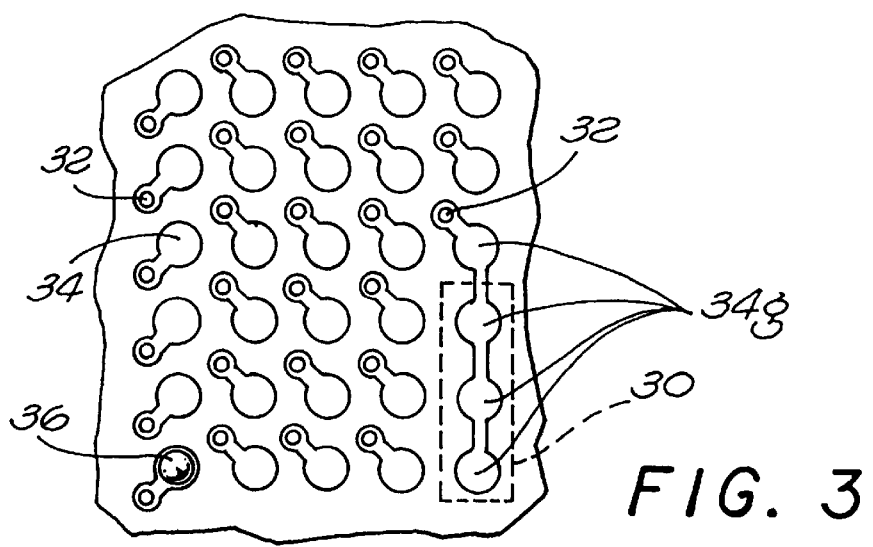
FIG. 3 is a bottom sectional view of the package.

To provide a rugged solder joint it is desirable to construct flat land strips 30 for the capacitors 28. Therefore, in the preferred embodiment there are no vias 32 located within the strips 30. As shown in FIG. 3, most of the lands 34 are coupled to a corresponding dedicated via 32. To eliminate vias and provide additional space on the second surface 16, one or more vias 32 may be connected to a group of lands 34g so that each land 34 does not require a separate dedicated via 32 that interferes with the land strips 30 of the capacitors 28. The land strips 30 of the second surface 16 are located above the lands 34 of the first surface 14 that are connected to the same single via 32. The group of lands 34g are typically connected to a power or ground bus of the package. The present invention provides additional space for mounting capacitors 28 without reducing the number of lands 34 on the package 10.

Figure 5:
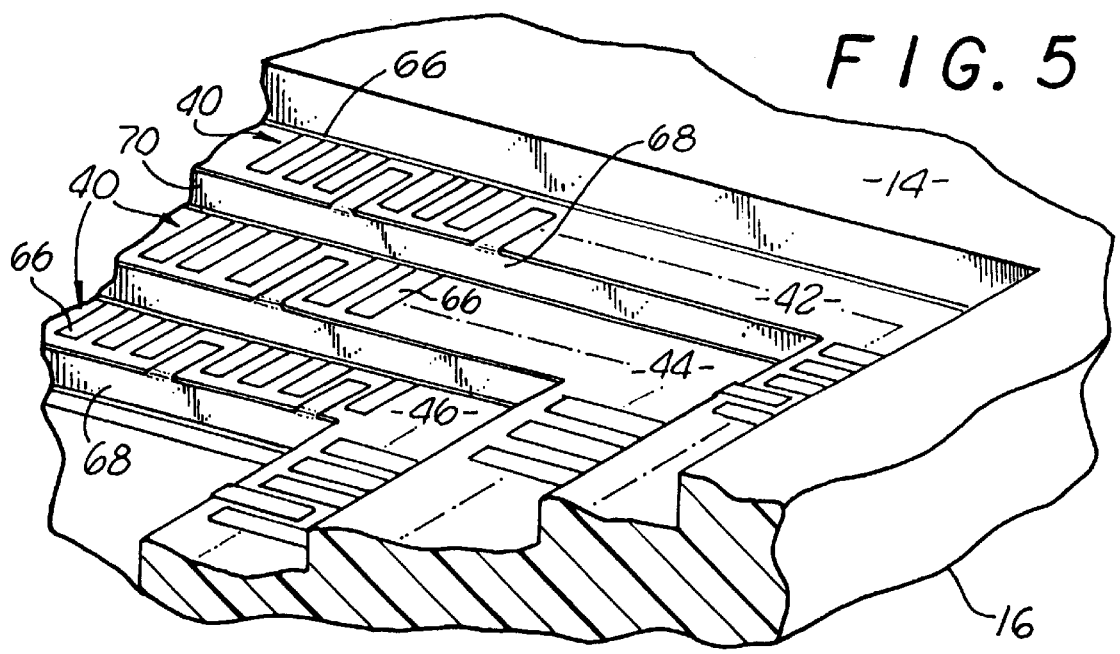
FIG. 5 is a perspective view showing a number of shelves within the package.

As shown in FIGS. 1 and 5, the package 10 has a plurality of bond fingers 40 located on bond shelves 42, 44 and 46 formed in the substrate 12. The bond fingers 40 are coupled to corresponding surface pads 48 of the integrated circuit 18 by bond wires 50. Although bond wires 50 are shown and described, it is to be understood that the integrated circuit 18 may be coupled to the bond fingers 40 by other means such as tape automated bonding (TAB) tape.

The substrate 12 has a plurality of internal routing layers 52, 54, 56, 58, 60, 62 and 64 that are connected to the vias 32. The routing layers and vias couple the bond fingers 40 to the external lands 34 of the package 10. As shown in FIG. 5, some of the bond fingers 40 have traces 66 that extend to the vias 32 or an internal conductive bus of the package. Some of the bond fingers 40 are connected to the conductive busses by conductive strips 68 that wrap around the edges 70 of the shelves. The wrap around strips 68 reduce the number of layers and vias required to construct the package 10. Additionally, the wrap around strips 68 reduce the inductive path to the conductive busses and the overall impedance of the package.

Figure 4:
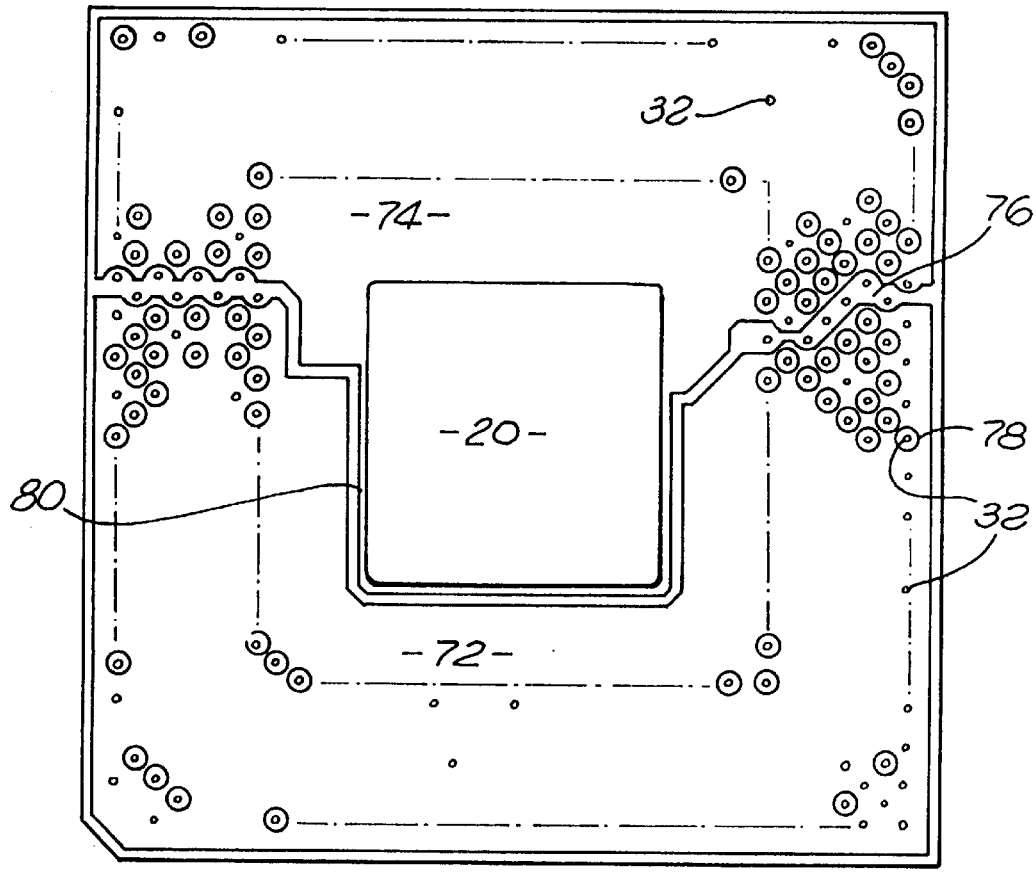
FIG. 4 is a top cross-sectional view showing a pair of power planes of the package.

FIG. 4 shows a layer of the substrate 12 which has a pair of conductive busses 72 and 74. The conductive busses 72 and 74 are separated by a dielectric space 76 to electrically isolate the busses. The busses 72 and 74 are typically dedicated to two different voltage potentials. Some of the vias 32 are connected to the conductive busses 72 and 74 to route the busses to the external lands 34. The remaining vias 32 are dedicated to other signals, power and ground busses within the package 10. The remaining vias 32 have outer rings 78 of dielectric spacing to isolate the vias from the conductive busses 72 and 74. The second bus 74 has a conductive strip 80 that extends around the entire die opening 20 so that the bus 74 can be connected by wrap around strips to any location on the shelves.

The integrated circuit 18 may be a microprocessor which requires power for the processor core and a separate power bus for the input/output (I/O) of the device. Referring to FIG. 1, in the preferred embodiment, the first layer 52 preferably has a first conductive bus dedicated to VSS of the device I/O. The VSS bus is coupled to the bond fingers 40 and external lands 34 by the vias 32. The second layer 54 preferably contains a plurality of signal lines that are coupled to the bond fingers 40 by the traces 66 and to the external lands 34 by vias 32. The third layer 56 preferably includes the split bus pattern shown in FIG. 4. The busses are coupled to the VSS and VCC busses of the device I/O. The VCC bus is coupled to bond fingers 40 on the first shelf 42 by wrap around strips 68.

The fourth layer 58 preferably has a plurality of signal lines that are connected to the bond fingers 40 by traces 66 and to the external lands 34 by vias 32. The fifth layer 60 preferably includes the split bus shown in FIG. 4. The busses are coupled to the VCC and VSS busses of the device I/O. The VSS bus is coupled to the bond fingers 40 of the second shelf 44 by wrap around strips 68. The sixth layer 62 preferably contains a conductive bus that is coupled to bond fingers 66 on the third shelf 46. The conductive bus is dedicated to the VCC bus of the device core. The seventh layer 64 preferably has a conductive bus that is dedicated to the VSS bus of the device core. The VSS bus is coupled to bond fingers 66 on the third shelf 46 by a wrap around strip 68. The second surface 16 of the substrate 12 may have metallization to electrically couple the heat slug 22 to a ground bus of the package. The die cavity 20 is typically filled with a plastic encapsulant 82 to enclose the integrated circuit 18.

The package 10 can be assembled by initially fabricating the substrate 12. The substrate 12 is assembled by etching the bus and signal layers on individual single-sided or double-sided substrates. The conductive strips 68 are then plated onto the edges of the shelves. The strips 68 are typically plated in electrolytic and electrolysis bathes. The individual etched boards are then bonded together to form the substrate 12. The bond fingers 40 are then plated with gold.

The package 10 of the present allows plating without a separate plating bar by utilizing the vias 32 and a layer of metallization located on the second surface 16. The metallization layer typically shorts the vias 32 of the substrate 12. A voltage source (not shown) can be connected to the bond fingers 40 and metallization layer to plate the substrate 12. The metallization layer is then etched off of the second surface 16 after the plating process. Eliminating the plating bar reduces the fabrication steps of the substrate 12 and the impedance of the package 10.

After the substrate 12 is fabricated, the heat slug 22 is mounted to the second surface 16. The capacitors 28 may also be soldered to the land strips 30. The integrated circuit 18 is mounted to the heat slug 22 and wire bonded to the bond fingers 40. The die cavity 20 is then filled with the encapsulant 82 to enclose the integrated circuit 18. The solder balls 36 can then be attached to the lands 34.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:
    a substrate that has a first surface and an opposite second surface, said substrate having a plurality of external lands that are located on said first surface and connected to each other by metal on said first surface and connected to only a single via that extends through said substrate, said substrate further having a land strip that is located on said second surface and connected to said via; and,
    a plurality of contacts that are attached to said external lands.

2. The package as recited in claim 1, further comprising an electrical device that is mounted to said land strip.

3. The package as recited in claim 1, wherein said substrate has a bond finger located on a bond shelf that has an edge, a first conductive bus, and a second conductive bus that is located on a common plane within said substrate as said first conductive bus, said second conductive bus being connected to said bond finger by a conductive strip that wraps around said edge of said bond shelf.

4. The package as recited in claim 1, wherein said substrate has three bond shelves that each have a plurality of bond fingers.

5. The package as recited in claim 1, further comprising a plurality of solder balls that are attached to said lands.

6. The package as recited in claim 3, wherein said substrate has a die cavity and said second conductive bus extends around said die cavity.

7. The package as recited in claim 6, wherein said electrical device is a capacitor.

8. The package as recited in claim 7, further comprising a heat slug that is mounted to said second surface of said substrate.

9. An integrated circuit package, comprising:

a substrate that has a first surface and an opposite second surface, said substrate having a plurality of external lands that are located on said first surface and are connected to each other by metal on said first surface and connected to only a single via that extends through said substrate, said substrate further having a land strip that is located on said second surface and connected to said via;

a plurality of contacts that are attached to said external lands; and, an integrated circuit that is attached to said substrate and coupled to said external contacts.

10. The package as recited in claim 9, further comprising an electrical device that is mounted to said land strip.

11. The package as recited in claim 10, wherein said substrate which has a bond finger located on a bond shelf that has an edge, a first conductive bus, and a second conductive bus that is located on a common plane within said substrate as said first conductive bus, said second conductive bus being connected to said bond finger by a conductive strip that wraps around said edge of said bond shelf.

12. The package as recited in claim 11, wherein said plane of said substrate has a die cavity and said second conductive bus extends around said die cavity.

13. The package as recited in claim 12, wherein said electrical device is a capacitor.

14. The package as recited in claim 13, further comprising a heat slug that is mounted to said second surface of said substrate.

15. The package as recited in claim 14, wherein said integrated circuit is a microprocessor.

16. The package as recited in claim 15, further comprising a plurality of solder balls that are attached to said lands.

\* \* \* \* \*